United States Patent [19]
Ellis

[11] Patent Number: 5,490,090
[45] Date of Patent: Feb. 6, 1996

[54] TWO TONE TEST METHOD FOR DETERMINING FREQUENCY DOMAIN TRANSFER

[75] Inventor: Vincent J. Ellis, Stafford, Va.

[73] Assignee: The United States of America as represented by the Secretary of the Army, Washington, D.C.

[21] Appl. No.: 260,293

[22] Filed: Jun. 14, 1994

[51] Int. Cl.$^6$ ........................ G01R 31/303; G01R 31/304
[52] U.S. Cl. ........................... 364/550; 324/501; 324/750
[58] Field of Search ................................... 324/501, 750; 342/165, 168; 364/423, 550

[56] References Cited

U.S. PATENT DOCUMENTS

| | | | |
|---|---|---|---|
| 2,942,257 | 6/1966 | Huntington | 342/165 |
| 3,363,249 | 1/1968 | Hershey et al. | 342/165 |
| 3,549,999 | 12/1970 | Norton | 324/751 |
| 4,802,216 | 1/1989 | Irwin et al. | 380/23 |
| 4,829,238 | 5/1989 | Goulette et al. | 324/750 X |
| 5,006,788 | 4/1991 | Goulette et al. | 324/750 X |

OTHER PUBLICATIONS

High Power Microwave Source And Facility Development, vol. 1–High–Power Microwave Source and Effects Research Mar. 1990, Contract No.: DNA 001–85–C–0218.

*Primary Examiner*—Edward R. Cosimano
*Attorney, Agent, or Firm*—Freda L. Krosnick; Frank J. Dynda

[57] ABSTRACT

A method has been developed and used to non-intrusively interrogate electronic systems in order to determine the system's characteristic response to electromagnetic energy. The method involves subjecting the system under test to two continuous wave signal sources of different frequencies fl and fh and measuring the difference frequency $\Delta f$ (fh–fl) emitted from the system under test. The difference frequency, created by mixing action of nonlinear electronic components within the system, is a relative indication of the system's response to fh, fl. By incrementing the two source signals fl and fh by the same frequency step size, $\Delta f$ remains constant and is measured for each fh,fl value. The compilation of amplitude measures of $\Delta f$, normalized by the corresponding amplitude measures of fh, fl, provides a relative measure of the frequency domain transfer function of the system under test. The present method is performed with the test equipment in total isolation from the system under test and may be used to quickly and cost effectively identify those frequencies to which the system under test may be susceptible.

15 Claims, 7 Drawing Sheets

TWO TONE TEST METHOD FOR DETERMINING FREQUENCY DOMAIN TRANSFER

FIELD OF THE INVENTION

Generally, all electronic systems are required to operate and/or survive in potentially hostile electromagnetic (EM) environments. To harden a system to known or predicted EM environments, one would like to observe the response of the system while being subjected to the EM environments of concern, make design changes to mitigate undesirable responses, and finally test the redesigned system to verify the effectiveness of the redesign. There are an infinite number of potential EM threats and it can be difficult and expensive to reproduce these EM threats and subsequently test the system to all environments of concern. Furthermore, any given system will be inherently hard to some EM environments and soft to others, therefore it is economically prudent to test the system only to those environments which actually have a potential to pose a threat to the system.

Various methods have been devised and practiced to obtain data which describes the behavior of a system to external EM environments. Many of these techniques are targeted at obtaining the frequency domain transfer of the system. Once the frequency domain transfer function is known, the transfer function may be numerically convolved with any source environment to produce the system response to that source. In this way, any number of EM environments may be convolved with the system transfer function inexpensively and quickly via computer in order to assess which EM environments may cause an undesirable response in the system. Further testing and design changes may then be focussed on the smaller number of EM environments that are identified as potentially threatening.

To understand how the EM environment is coupling to, entering into and affecting the system, the data collected (transfer function) is in the form of normalized electrical response (voltage or current) at one or more circuit nodes. In order to obtain these measured voltages and currents at circuit nodes, a probe must be inserted in close proximity to the circuit node. The insertion of and the probe itself can corrupt the collected data by loading the circuit node and modifying the system's topology and hence transfer function. An ideal method of obtaining the transfer function would be to use an instrumentation system that is physically isolated from the system under test such that the measurement system does not influence the system or the incident EM environment. Furthermore, to test the system to all EM environments of concern, wideband probes and sensors are usually required to cover several decades of frequency response.

The present invention relates to a method for determining the frequency domain transfer function of an electronic system. Once the transfer function of a system is known, any source function may be convolved with the system's transfer function resulting in a response (to the applied source) function for the system. The present invention utilizes electromagnetic signals to interrogate an electronic system, thereby indicating the relative response of said system to electromagnetic energy. The invention provides a novel means to obtain a system's electromagnetic frequency response which is performed totally external to the system under investigation and is non-intrusive of the system under investigation. The methodology involves subjecting a system to two electromagnetic signals of different fundamental frequencies fl and fh (tones); and measuring an electromagnetic signal leaving the system under test, of a characteristic frequency which is the arithmetic difference of frequencies fl and fh (fh−fl=Δf). This difference frequency Δf is caused to be present due to mixing of fl and fh by nonlinear electronic components within the system under test. The mixing action will also produce a sum frequency fh+fl and harmonics of the sum and difference frequencies, but the difference frequency is the component sought because it remains constant as long as fl and fh are incremented by the same amount over the frequency range of interest.

DESCRIPTION OF RELATED ART

To date much has been invested in developing probes and sensors that are very small in size, have very wide response bandwidths, and that are made out of nonmetallic parts (photonics). This approach has proven to be very expensive and plagued with the common problems associated with pushing the edge of technology.

The phenomenon of signal mixing, upon which the present invention relies is well known as this is the principle upon which radio receivers operate. Radio receivers utilize the mixing action of semiconductor components to demodulate information signals from carrier radio waves.

Additionally, a technique (beat frequency) has been used to artificially induce a signal into a system that ordinarily would not couple into the system. By subjecting the system to two signal sources which can enter the system easily, the desired frequency signal can be produced within the system, due to mixing, if the two source signals are properly chosen. Similarly, if the system has an internal clock or internal signals of a known characteristic frequency, a single source may be used to couple EM energy into the system and mix with the system's own internal oscillator to produce the desired Δf.

A technique similar to the present invention has been suggested for system identification. To illustrate by way of example suppose we know that at some location there exists black boxes. We know the black boxes are there and we know what they are and generically what they do. The problem is that there are many different types and models of these black boxes known to exist and we would like to know which type and models of black boxes are present. If we know that black box type A runs on an internal oscillator at 1 Mhz and box type B runs at 2 Mhz and box C operates at 3 Mhz, etc., then we can radiate the location with a source at 100 Mhz for example. We then try to detect reradiated signals at 99, 98, 97 Mhz, etc., which will indicate which type of box is present, due to the difference frequency created by mixing.

The present invention offers an alternative to the high dollar, high technology approaches. Although the present invention provides only relative data, the data is obtained quickly and inexpensively and most importantly without corrupting the data or violating the integrity of the system under test.

SUMMARY OF THE INVENTION

The method comprises simultaneously subjecting a test object to two signal sources of different fundamental frequencies ($fl_1$ and $fh_1$) and measuring the amplitude of the signal leaving the test object at a frequency $\Delta f_1$ which is the arithmetic difference of the two source frequencies ($fh_1-f_1$). This difference frequency is indicative of the two source signals entering the test system, reaching at least one nonlinear electronic component and mixing. The above procedure is then repeated with new source frequencies $fl_2$ and $fh_2$ whose difference frequency $\Delta f_2$ is equal to $\Delta f_1$ and the same difference frequency is monitored emanating from the system. This procedure is continued for all frequencies of interest $fh_n, fl_n$.

Each amplitude measure of $\Delta f_n$ is normalized by the amplitude of $fl_n$ and $fh_n$ and the cumulation of this normalized data in total represents the relative response of the system's electronic circuitry to external electromagnetic stimulation over the frequency range from $fl_1-fh_n$. That is, the relative frequency domain transfer function of the electronics system has been determined. The normalized data ($\Delta f$ normalized by $fl$, $fh$) do not represent an absolute quantification of the system but simply represents relative response of the system over the frequencies of interest. If the normalized data for $\Delta f_1$ is a factor of ten greater in amplitude than the normalized data for $\Delta f_{14}$ for example, this simply indicates that the system in general is 10 times more responsive to frequencies in the range of $fl_1$, $fh_1$ than to frequencies in the range of $fl_{14}$, $fh_{14}$.

The system under test will obviously have a different transfer function for each orientation, EM field polarization, operational configuration, etc. Therefore a complete characterization of the system may actually involve many transfer functions, or a worst case transfer function, or a statistical spread of the measured transfer functions. Several different equipment configurations and test setups may be used to obtain the desired data, however all obey the basic methodology. The type of system under test and the type of data sought will determine the appropriate test configuration. All test configurations are easily adapted to computer control for efficient operation and analysis of the resultant data.

Accordingly, it is an object of the present invention to determine the characteristic frequency domain response of an electronic system to external electromagnetic energy.

It is a further object of the invention to nonintrusively obtain the relative frequency domain response of an electronic system, whereby the electronics of the system under test and the test apparatus remain totally isolated.

It is yet another object of the invention to obtain the relative frequency domain response of an electronic system quickly and inexpensively using widely available laboratory equipment.

These and other objects, features, aspects and advantages of the present invention will become more apparent from the following detailed descriptions when taken in conjunction with the accompanying drawings.

DESCRIPTION OF THE PREFERRED EMBODIMENTS

Figure 1:
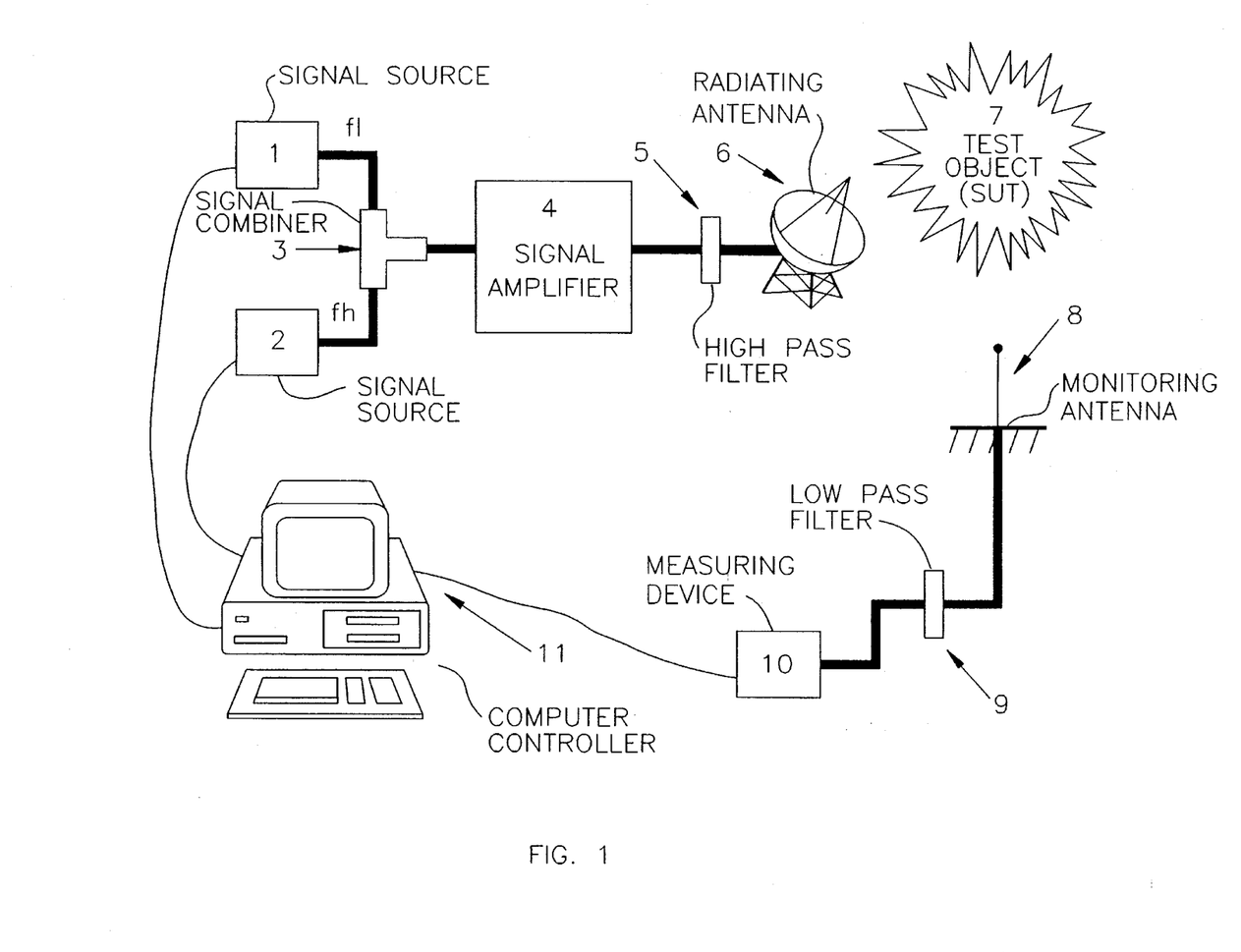
FIG. 1 is an equipment operational layout illustrating the test object 7 being free-field illuminated by an EM source (frequencies fl and fh) and a monitoring antenna 8 feeding data to a computer.

FIG. 1 depicts the equipment layout for measuring the transfer functions of an electronic system via one source antenna and one remote sensor. Two signal sources 1 and 2 are used to generate two sinusoidal signals of frequency fl and fh respectively. The sources 1 and 2 may be sine wave generators, network analyzers or other signal source capable of producing AC signals over the frequency range of interest. The two signals fl and fh are combined by a signal combiner 3 and the combined signal is fed to a signal amplifier 4. The amplifier 4 amplifies the combined signal and the amplified signal is fed through high pass filter 5 to radiating antenna 6. The combined and filtered source signal is radiated toward the system under test (SUT) 7. The source signal will couple to the SUT, enter the SUT, travel circuit pathways and eventually reach nonlinear electronic components. The nonlinear components will mix the fl and fh fundamental components in the source signal and produce the difference frequency $\Delta f(fh-fl)$. The $\Delta f$ signal will travel pathways and radiate from the system in a reverse manner as the source signals coupled into the SUT. The remotely located sensor 8 detects the $\Delta f$ signal radiating from the SUT 7 and feeds the detected $\Delta f$ through low pass filter 9 to measuring device 10. An optional computer controller 11 may be used to control the signal sources and retrieve and archive data from the measuring device.

The mixing action that occurs at the nonlinear electronic components actually produces sum (fh+fl) and difference (fh−fl) frequency components as well as harmonics thereof. The harmonics will be severely reduced in amplitude and therefore are not chosen as the signal component to be measured. One could attempt to measure the sum (fh+fl) component, however as fh and fl are incrementally changed to test the SUT over all frequencies of interest, the sum component will change in frequency and continue to increase. To measure the sum signal, one would need a wideband high frequency measurement system which is contradictory to the novelty of the present invention. Additionally, since the sum signal would change with each incremental change of fh and fl, the reverse transfer function of the sum frequencies from within the SUT to the sensor 8 would also change with each incremental change and therefore would have to be known in order to correct the measured data. Therefore, the difference component (fh−fl) $\Delta f$ is chosen as the signal to be measured. When fh and fl are incremented by the same amount, the $\Delta f$ component remains constant in frequency. With $\Delta f$ constant, an optimal narrow band high gain sensor a can be used. And although the transfer function of $\Delta f$ from within the SUT to the sensor is unknown, it is constant for all incremental values of fh and fl.

The Δf signal radiating from the SUT is not only indicative of the coupling efficiency of the source signals into the SUT, but is also indicative of the mixing efficiency (component response) of the nonlinear components which produced the Δf signal. The amplitude of Δf is dependent upon the amplitude of fh and fl components that reach the nonlinear electronics and is therefore indicative of the coupling efficiency of fh,fl into the SUT. The amplitude of Δf is also dependent on the efficiency of the nonlinear components in mixing fh and fl and is therefore indicative of the electronics response to frequencies fh and fl. Because the SUT coupling efficiency, the electronic component response, and the coupling efficiency of Δf from inside the SUT to the sensor are inseparably combined in the measurement of Δf at the sensor 8, the data as collected is relative and not absolute.

Prior to choosing the appropriate equipment for the system(s) to be tested, a few design choices and unknowns must be resolved. First, it must be decided what frequency range will be covered and the sources chosen to accommodate this range of frequencies. Second, it must be determined how wide (frequency) the resonant response bandwidth of the system are or are expected to be. Although a system will have peak responses at certain frequencies, these response peaks do not have zero bandwidth, rather there is some range of frequency variance both above and below the resonant peak to which the system will respond with reasonable power variances (3 dB). Once the 3 dB resonant response bandwidth is determined, Δf must be chosen such that it is smaller than the 3 dB resonant response bandwidth of the system. Because fh and fl are not the same frequency, they will each couple into the system differently. By choosing the difference between fh and fl (Δf) to be small compared to the resonant response bandwidth, the variance in coupling efficiency of fh versus fl will be small or negligible or at least bounded. Also the values of fh and fl should never equal Δf. Another consideration for the choice of Δf that must be played against the considerations discussed heretofore, is the reverse transfer function of Δf from within the system to without. It is desirable, for signal-to-noise considerations, that the Δf component be capable of radiating out of the system with as little power loss as possible. The approach to choosing Δf is simply that Δf should be made as small as possible such that the instrumentation used can adequately discriminate fh and fl and such that Δf can radiate out of the system with sufficient power to be measurable. All effort should be made to keep Δf smaller than the resonant response bandwidth.

Some of the signal fl from source 1 will leak into the output port of source 2 and likewise some fh signal will leak into source 1. Since the sources contain circuitry with nonlinear electronic components, each source will mix the two signals and produce signals of frequency Δf (fh−fl). The amplifier 4 will amplify Δf created by sources 1 and 2 and since the amplifier also has nonlinear electronic components, the amplifier will also mix fundamentals fl and fh and produce amplified Δf signals. Because the test equipment is mixing the source signals and producing Δf signals, the Δf signals must be filtered out before radiating the signals via antenna 6. Without filtering the Δf created by the test equipment, this artificial Δf would be radiated and hence measured by the sensor 8 and would be indistinguishable from the Δf signals actually created by the system under test. The only Δf desired is the Δf component created by mixing fl and fh within the system under test. The filter is preferably passive and should be high order providing 80 dB or more attenuation in the stop band and provide minimal attenuation and phase distortion in the pass band. Additionally, caution must be used if the filter is to be active as active filters may themselves cause mixing and incidental Δf signals. The filter 5 must be chosen so that Δf lies in the stop band and the lowest value of fl is well within the passband. The filter must also have a power rating appropriate for the amplifier to which it is connected.

The sensor 8 should be resonant, or at least have a high gain, at the chosen Δf to provide good sensitivity. Since Δf is constant, the sensor can be easily constructed to optimize the narrow band measurement of Δf. Sensor 8 is preferably passive as to not create extraneous Δf signals due to mixing of incidental fh and fl that may be picked up by the sensor. The measuring device 10 can be any receiver capable of being tuned narrow-band to Δf, such as an rf receiver, spectrum analyzer, power meter, etc. Because the measuring device 10 may contain nonlinear electronic components, incidental fh and fl signals picked up by the sensor 8 must be filtered out to prevent them from mixing in the measuring device and producing extraneous Δf signals. The filter 9 is a high order low pass filter designed such that Δf is well within the passband and all values of fh and fl are well within the stopband.

To obtain the frequency domain relative transfer function of the system under test, the signal sources are originally set with source 1 set to $fl_1$, which is the lowest frequency of concern for the transfer function, and source 2 set to $fh_1$ ($fh_1=fl_1+\Delta f$). The SUT is subjected to these signals and $\Delta f_1$ is measured via sensor 8 and measuring device 9. The measurement of $\Delta f_1$ is then sent to a computer 11 for processing and storage. Then source 1 is incremented to produce signal $fl_2$ and source 2 to $fh_2$ ($fh_2=fl_2+\Delta f$), and $\Delta f_2$ is measured. This procedure is repeated until the highest frequency of concern for the transfer function, $fl_n$ ($fh_n=fl_n+\Delta f$), is reached. The amount to increment the source signals is chosen based on the resolution desired and the responsiveness of the SUT to the frequency range of concern; the only requirement is that both sources 1 and 2 be incremented by the same amount.

Figure 5:
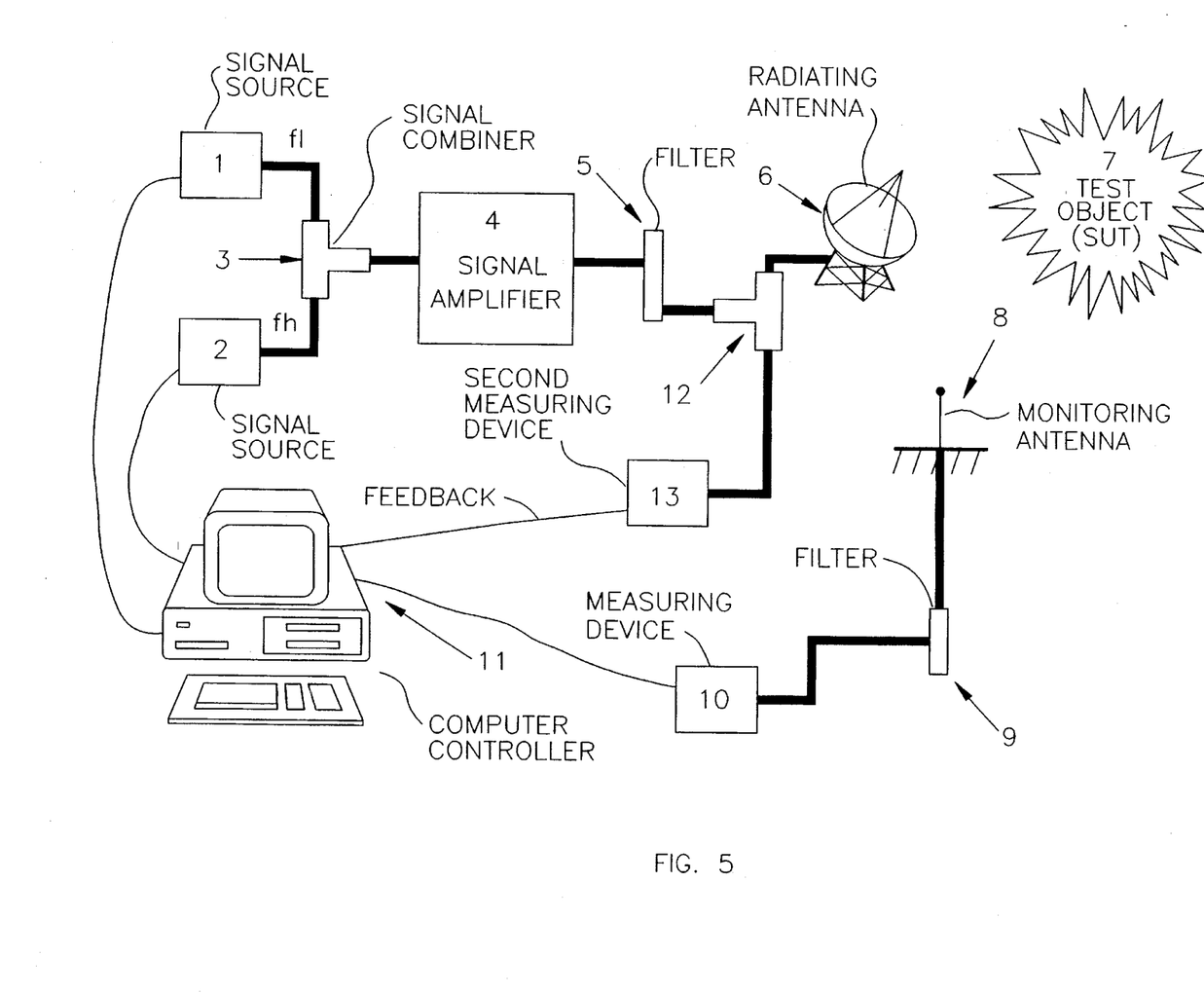
FIG. 5 is an equipment operational layout which is identical to FIG. 1 except that the source signal is shown split and fed back to a measuring device 13 which is then fed to a computer controller. This feedback loop provides for automatic gain control (AGC).

The measured and stored amplitude values of Δf must be normalized by the corresponding amplitude values of fh and fl. Because the sources, the amplifier, and the antenna will exhibit frequency dependant behavior, the measurement of each $\Delta f_n$ must be normalized to account for variances in corresponding $fh_n$ and $fl_n$ incident on the SUT. Since the data is only relative, there is no requirement to normalize the data by an absolute measure of fh and fl, therefore there are several ways in which to normalize the data as long as all data is treated consistently. One method would be to normalize the measure of each Δf by the product of the corresponding fh and fl;

$$\frac{\Delta f_n}{(fh_n * fl_n)}$$

for each value of n. Alternatively, Δf could be normalized by the average amplitude of fh and fl;

$$\frac{\Delta f_n}{(fh_n + fl_n)/2}$$

for each value n. Other equally valid normalization procedures may be used as long as all data is treated consistently and the normalization accounts for amplitude variances of fh and fl for each data point. The amplitude values of fh and fl may be obtained through measurement of the fh and fl signals (see FIG. 5 description) or numerical extrapolations of the signal source settings. The normalized values of Δf ($\Delta f_1 \ldots \Delta f_n$) represent the frequency domain relative transfer function of the SUT.

Figure 2:
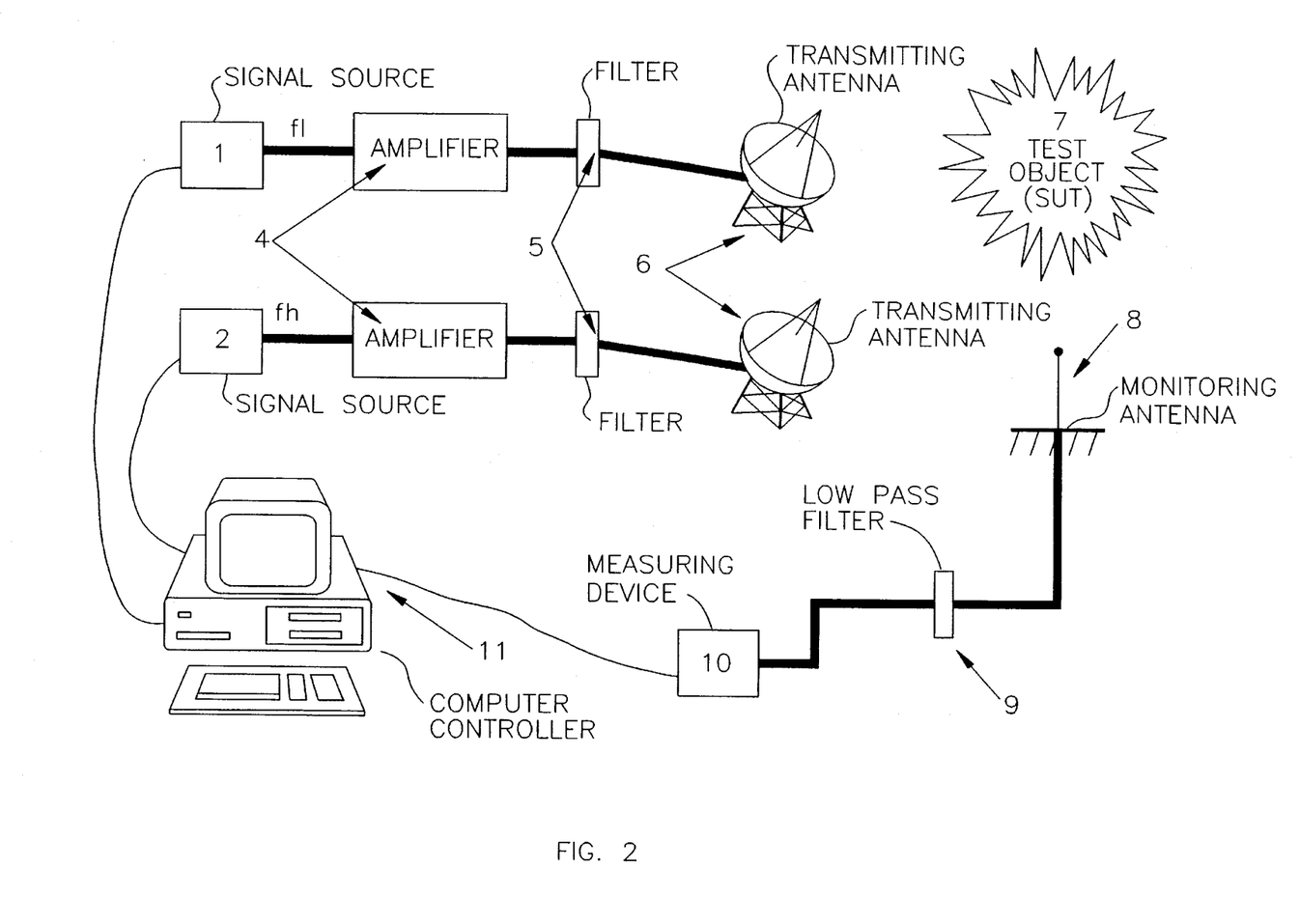
FIG. 2 is an equipment operational layout which is similar to FIG. 1 except that the two source signals fl and fh are not combined and fed to one antenna, but rather are individually fed to separate transmitting antennas.

FIG. 2 is a variation of the equipment setup shown in FIG. 1. Here the two sources 1 and 2 are separately fed to amplifiers 4, filters 5, and antennas 6, and are not combined as in FIG. 1. Because the source signals are not combined, there is a lesser opportunity for the signals to mix and produce $\Delta f$ in the source equipment. There is still the possibility (based on proximity and orientation) that signals emitting from one antenna could couple to the other antenna and reach an amplifier and mix. This cross coupling can usually be made minimal with proper placement of the antennas. Filters 5 may be used for extra caution, however the performance characteristics of the filters may be more relaxed than in the method of FIG. 1.

Figure 3:
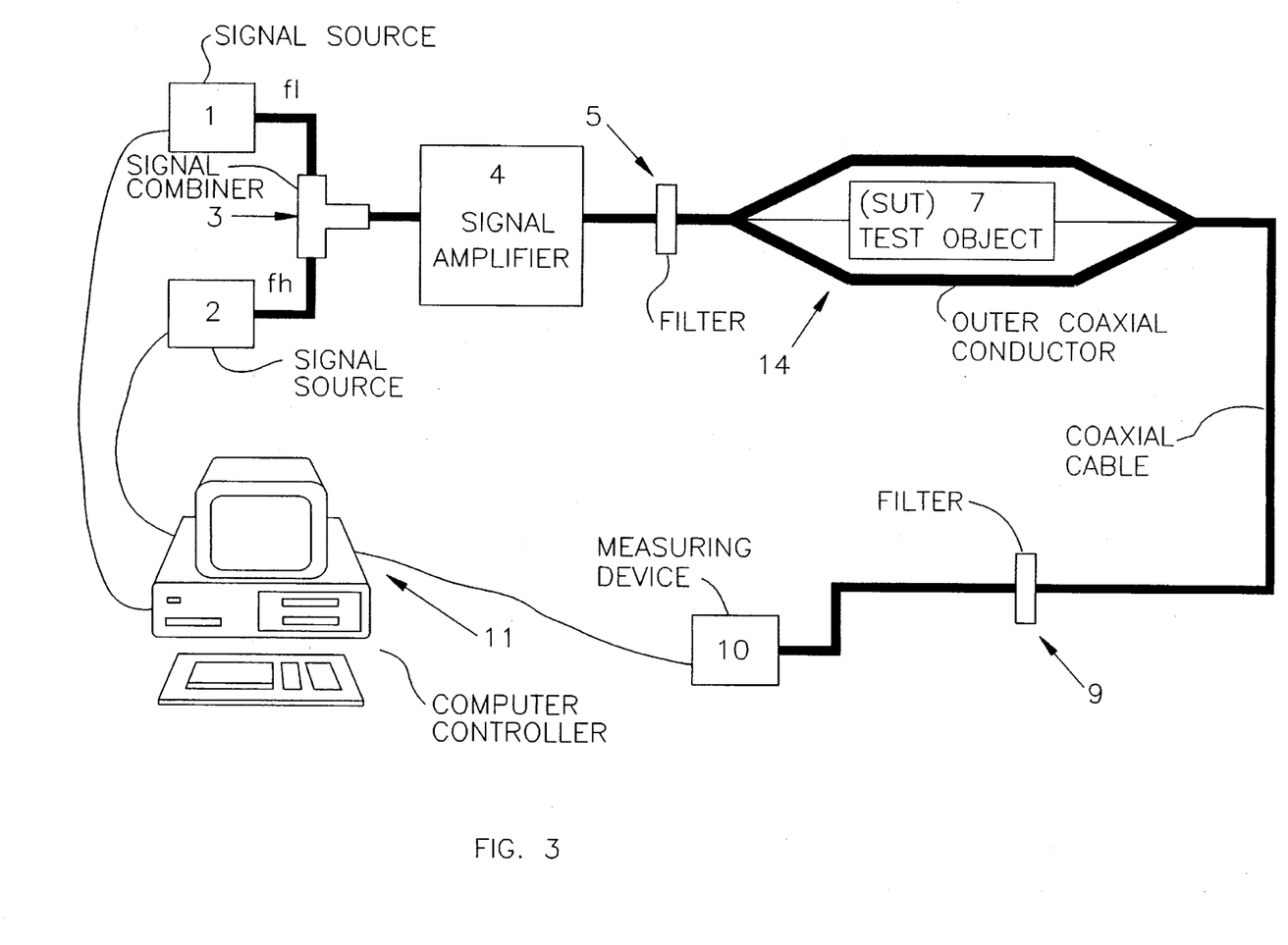
FIG. 3 is an equipment operational layout in which the source signals are directly injected onto the system under test as opposed to being radiated at the system. The response data is collected as current flowing on the system under test as opposed to monitoring re-radiated fields.

FIG. 3 is a variation of FIG. 1 in which the source signals are not radiated at the test object 7 but rather are directly injected onto the test object. Here the test object is made part of a coaxial test fixture. Using the test object as the center conductor, an outer coaxial conductor (shield) 14 is formed completely enclosing the test object. The measurement of $\Delta f$ may be obtained and fed to filter 9 and measurement device 10 by simply connecting a coaxial cable from the test fixture, test object 7 and the shield 14 combined, to the filter 9. It is well known in the art how to physically construct a coaxial structure such that the structure maintains impedance matching. The advantage to this setup versus that of FIG. 1 is that of high source signal strength. With the test setup of FIG. 3, less source signal power is lost than in the case of radiating the source signals. With more source signal power delivered to the test object, $\Delta f$ will have a larger power and therefore be easier to measure as signal-to-noise requirements of the measurement system will be relaxed. A disadvantage is that it may be difficult or impossible to perform parametric studies of field polarization, orientation, and configuration because of physical limitations of the direct inject technique.

Figure 4:
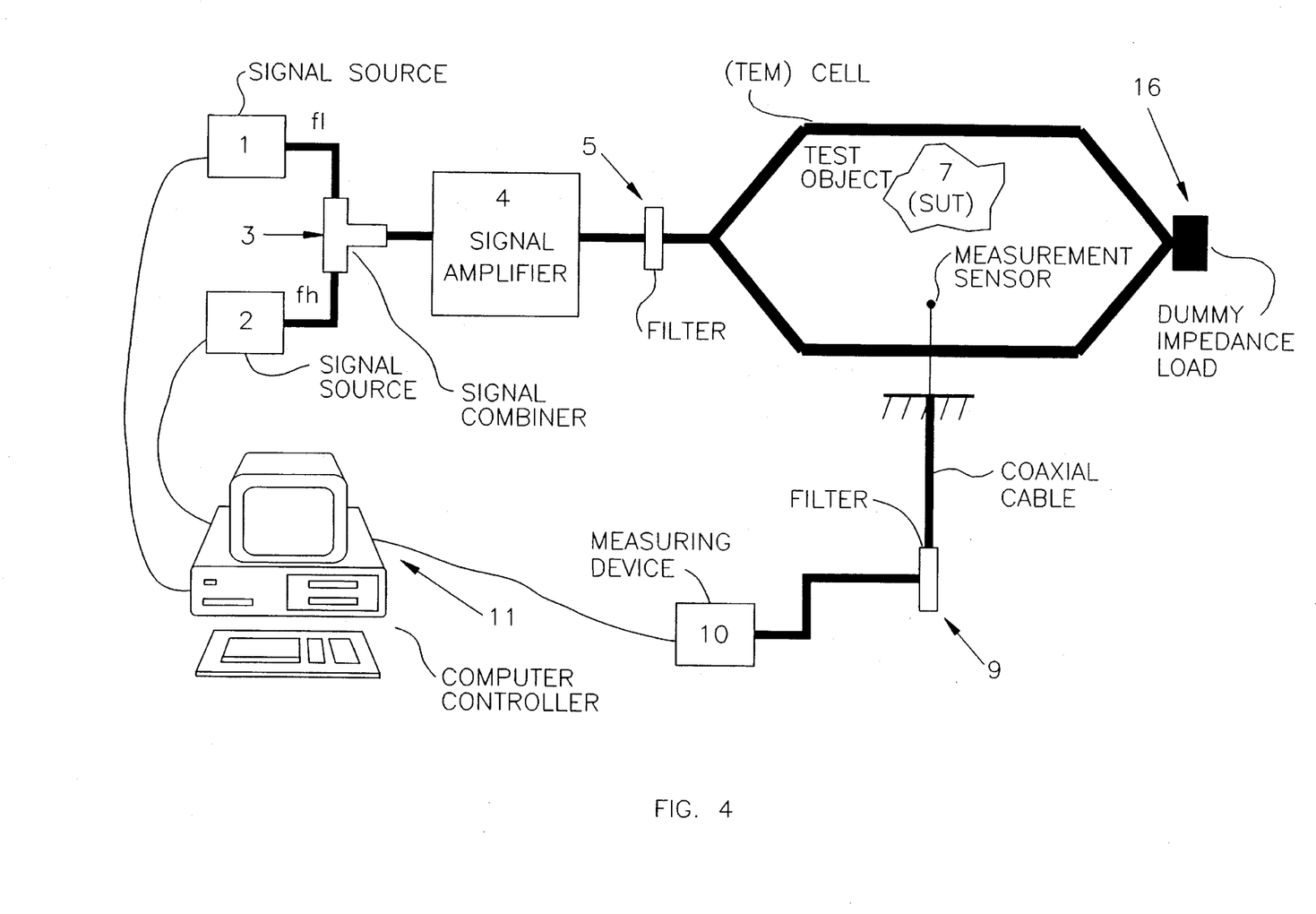
FIG. 4 is an equipment layout in which the test object is placed in a transverse electromagnetic wave (TEM) cell and is subjected to source signal TEM fields.

FIG. 4 is a variation of FIG. 1 and FIG. 3 in which an attempt is made to exploit the advantages of each. Here the test object 7 is illuminated by bounded transverse electromagnetic (TEM) fields. By bounding the TEM in a TEM cell, less power is lost to the atmosphere, as in radiating, and by using TEM with an adequately sized cell, orientation and configuration studies may be performed. Here the structure must be loaded with dummy impedance 16. The measurement sensor may be placed within the cell to measure radiated $\Delta f$. It may also be possible to directly measure $\Delta f$ by connecting the TEM cell directly to filter 9 and measuring device 10 via a coaxial cable, similar in manner to that shown in FIG. 3.

FIG. 5 is shown as a variation of FIG. 1, however the modifications may be applied to any of the setup variations discussed heretofore. As discussed above, a computer 11 may be used to collect and process data as well as to control the signal sources and other instrumentation. Here we use a signal splitter 12, to pick off a portion of the source signal, and a second measuring device 13 to provide feedback to the computer controller. In this manner an automatic gain control (AGC) has been established and the computer 11 may be used to measure the amplitude of fh and fl being produced and subsequently adjust the signal sources 1 and 2 such that fh and fl are equal in amplitude and constant over the frequencies of interest. By keeping the composite signal source constant, normalization of the measured $\Delta f$ can be eliminated or at least made rather trivial. The location to pick off and feed back the source signal depends on the frequency response of the equipment used. The pick off point shown in FIG. 5 is appropriate for an antenna 6 which is flat in frequency response for frequencies of interest. However if the antenna frequency response has significant structure over the frequency band, the pick off point may be located some distance in front of the antenna and comprise a sensor and a measuring device. If the antenna response has been measured and digitized, the pick off could be as shown in FIG. 5 and the measured feed back could be numerically corrected by the computer for antenna response and the appropriate adjustments made and sent to the signal sources. This setup is extremely useful in automating the test procedure.

Figure 6:
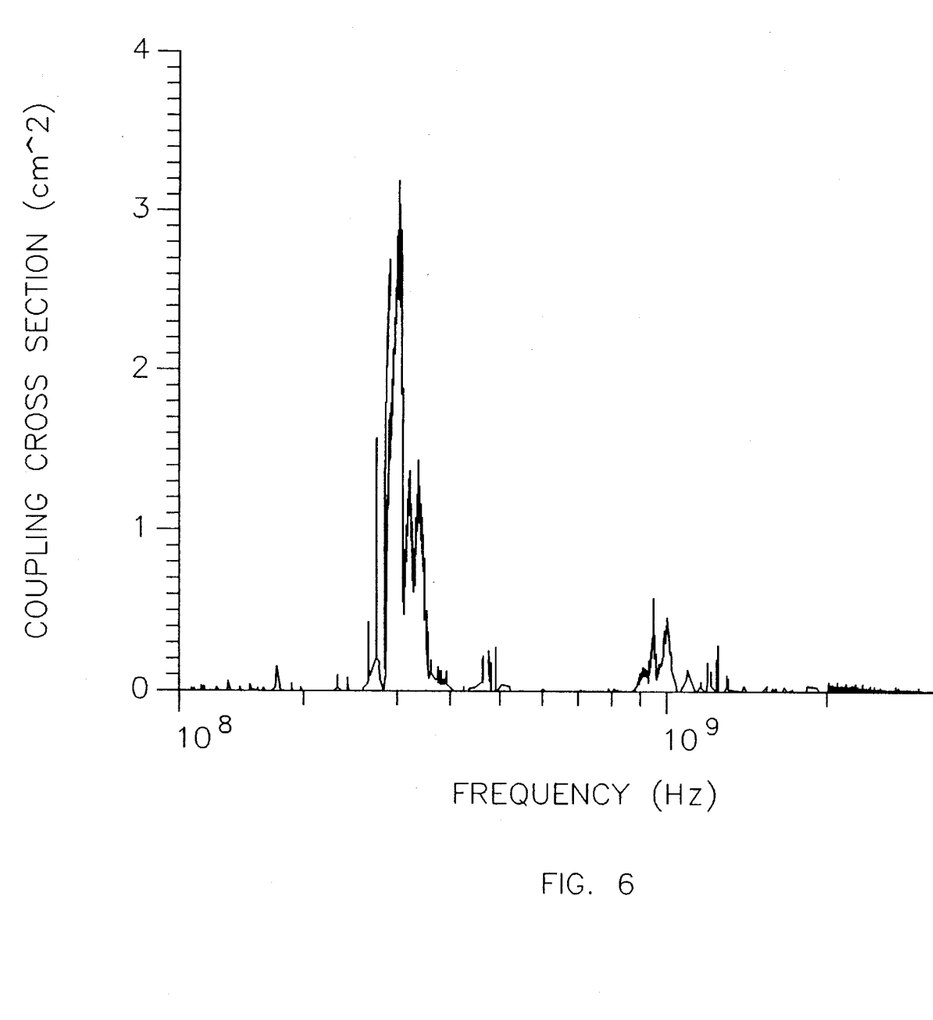
FIG. 6 is a representative piece of data showing the frequency domain transfer function of a system. The datum was obtained using a technique other than that of the present invention, utilizing circuit probes, wideband sensors, and extensive experimentation and data processing.

FIG. 6 is a representative datum for a tested system, which shows the response for a test point within the system. The response is an absolute transfer function in the form of coupling cross section ($cm^2$) for one test point and one configuration. By multiplying EM source field power ($W/cm^2$) by the cross section datum ($cm^2$) the actual power (Watts) at the test point is obtained. The datum was obtained by inserting and attaching voltage probes to the circuitry within the test object, illuminating the object with EM fields in an anechoic test chamber, and measuring the voltage at the test points. This technique requires state-of-the-art wideband instrumentation as well as trained personnel to operate the equipment. The datum shown in FIG. 6 (as well as the majority of data taken) shows the system to have main structure at approximately 300 MHz, 310 mHz and 1 GHz.

Figure 7:
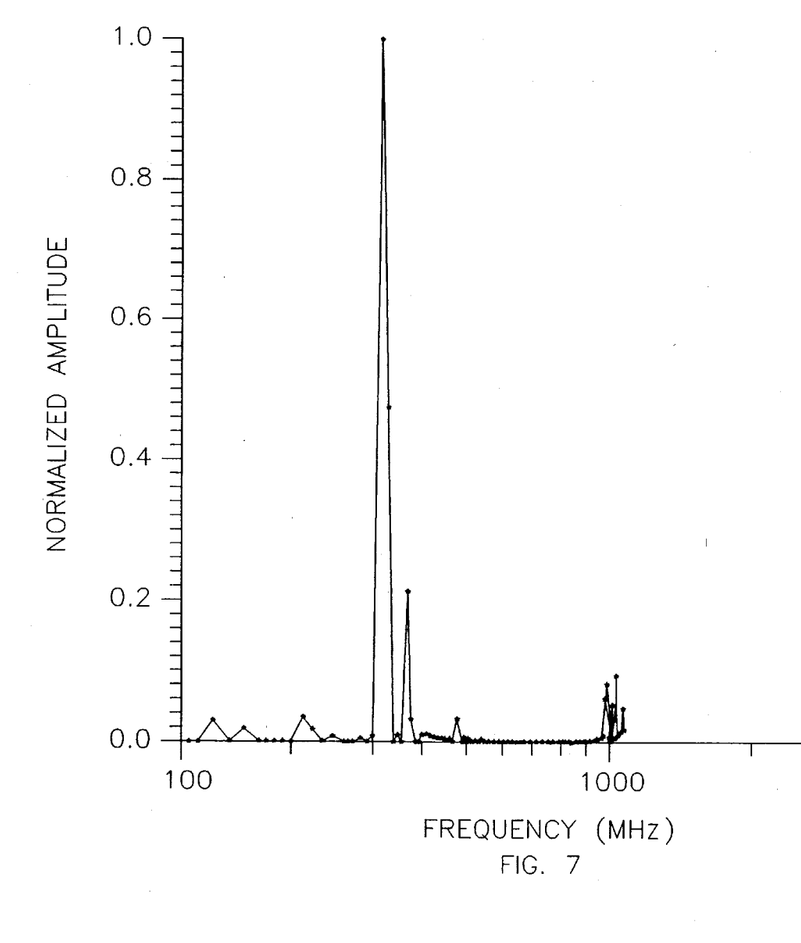
FIG. 7 is a piece of data for the same system as shown in FIG. 6, however this datum was obtained using the present invention.

FIG. 7 is a datum taken on the same system as in FIG. 6 utilizing the present method. Here the datum was taken using the setup of FIG. 3, and as such represents the response of the system as a whole. The datum taken with the present method matches very well with that of FIG. 7 as well as the average response of the system obtained by processing the many pieces of data obtained by the method as in FIG. 6. Although the present method provides only relative data, the important features of the datum is that like that of FIG. 6, FIG. 7 shows primary structure at 300 MHz, 310 MHz, and 1 GHz, approximately. FIGS. 6 and 7 are also consistent in relative amplitude; i.e., FIG. 7 shows the 300 MHZ resonance to be on the order of eight to ten times the amplitude of the resonance at 1 GHz which is also indicated in FIG. 6. But perhaps equally important is that the test efforts involved in obtaining the data represented by FIG. 6 equates to approximately 3 man months worth of effort, whereas the datum of FIG. 7 using the present method (not automated) equates to approximately 3 man hours worth of effort.

Obviously, numerous modifications and variations of the present invention are possible in light of the enclosed disclosure. It is therefore to be understood that the present invention can be practiced otherwise than as specifically described herein and still be within the true spirit and scope of the present invention.

What is claimed is:

1. A method of determining the response of electronic systems to external electromagnetic stimulus, comprising the steps of:

generating a first alternating current source signal of a known frequency and amplitude;

generating a second alternating current source signal of a known frequency close in value but not identical to the frequency of said first signal, and of a known amplitude approximately equal to the amplitude of said first signal;

applying said first and said second signal simultaneously to an electronic system to be analyzed;

measuring the amplitude of a third signal emanating from said electronic system at a frequency, which is the arithmetic difference of the frequency of said second signal and the frequency of said first signal, and is created by mixing of said first signal and said second signal by nonlinear components within said electronic system;

normalizing the measured amplitude of said third signal by the amplitude measures of said first and said second signals to produce the relative response of said electronic system to the frequencies of said first and said second signals.

2. A system response measuring method in accordance with claim 1 wherein said normalization step comprises dividing the amplitude measurement of said third signal by the product of the amplitude measurements of said first and said second signals.

3. A system response measuring method in accordance with claim 1 wherein said normalization step comprises dividing the amplitude measurement of said third signal by the average of the amplitude measurements of said first and said second signals.

4. A system response measuring method in accordance with claim 1, wherein said generating, applying, measuring, and normalizing steps are repeated for all source frequencies of interest through incrementally increasing the frequency of said first and said second source signals from the lowest frequency of interest to the highest frequency of interest, the frequencies of said first and second signals each incremented by a constant amount each repetition, such that the third signal remains at a fixed frequency.

5. A system response measuring method in accordance with claim 4, wherein said repetitive generating, applying, measuring, and normalizing steps are automated under computer control.

6. A system response measuring method in accordance with claim 5, wherein said computer control repetitive steps further comprises the steps of:

measuring the amplitudes of said first and said second signals;

feeding back the amplitude measures of said first and second signals to said computer;

sending computer generated correction instructions to said first signal generating means and said second signal generating means such that said signal generators are caused to produce constant and equal amplitude said first and said second signals for all frequency increments.

7. A system response measuring method in accordance with claim 1, wherein said applying step comprises the steps of:

amplifying said first and said second source signals individually to produce a first and second amplified signals;

filtering said first and said second amplified signals to effectively reduce extraneous signals of a frequency equal to the frequency of said third signal, which is the arithmetic difference of the frequencies of said first and second signals;

simultaneously subjecting said system to said first and said second filtered signals.

8. A system response measuring method in accordance with claim 1 wherein said applying step comprises the steps of: combining said first and said second signals; amplifying said combined signal;

filtering said amplified signal to effectively reduce extraneous signals of a frequency which equal to the frequency of said third signal, which is the arithmetic difference of the frequencies of said first and said second signals;

subjecting said electronic system to said filtered signal.

9. A system response measuring method in accordance with claim 7 or claim 8 wherein said subjecting step consists of radiating said filtered signals at said system through an antenna.

10. A system response measuring method in accordance with claim 7 or claim 8 wherein said subjecting step consists of directly injecting said filtered signals onto said system.

11. A system response measuring method in accordance with claim 7 or claim 8 wherein said subjecting step further comprises:

placing said system within a transverse electromagnetic field test cell;

feeding said filtered signals to the input of said transverse electromagnetic field test cell, wherein transverse electromagnetic fields will be produced inside said test cell and will illuminate said system.

12. A system response measuring method in accordance with claim 1 wherein said measuring step comprises the steps of:

receiving said third signal;

filtering said received signal to effectively reduce extraneous signals of frequencies equal to the frequencies of said first and said second signals;

feeding said filtered signal to a measuring device to obtain the amplitude of said filtered signal;

feeding said amplitude measurement to a data storage medium.

13. A system response measuring method in accordance with claim 2 wherein said receiving step consists of coupling said third signal from said system through direct conductor connection to said system.

14. A system response measuring method in accordance with claim 12 wherein said receiving step consists of coupling said third signal from said system through coupling to an electromagnetic sensor said third signal being radiated from said system.

15. A system response measuring method in accordance with claim 12 wherein said feeding to storage medium step further comprises digitizing the amplitude measurement.

* * * * *